US011706867B2

(12) United States Patent
Balana Avila et al.

(10) Patent No.: US 11,706,867 B2
(45) Date of Patent: Jul. 18, 2023

(54) SYSTEM AND METHOD FOR PROVIDING AN ELECTRICAL GROUND CONNECTION FOR A CIRCUIT ASSEMBLY

(71) Applicant: Lear Corporation, Southfield, MI (US)

(72) Inventors: Joan Balana Avila, Valls (ES); Josep Maria Combalia, Valls (ES); Gloria Simo Quinonero, Valls (ES); Jordi Angel Serrano, Valls (ES)

(73) Assignee: LEAR CORPORATION, Southfield, MI (US)

( * ) Notice: Subject to any disclaimer, the term of this patent is extended or adjusted under 35 U.S.C. 154(b) by 255 days.

(21) Appl. No.: 17/248,494

(22) Filed: Jan. 27, 2021

(65) Prior Publication Data

US 2022/0240371 A1    Jul. 28, 2022

(51) Int. Cl.
| | |
|---|---|
| *H05K 1/02* | (2006.01) |
| *H05K 5/00* | (2006.01) |
| *H01R 4/30* | (2006.01) |
| *H01R 4/64* | (2006.01) |
| *H01R 12/71* | (2011.01) |
| *H01R 13/621* | (2006.01) |

(52) U.S. Cl.
CPC ......... *H05K 1/0215* (2013.01); *H01R 12/716* (2013.01); *H01R 13/6215* (2013.01); *H05K 5/0026* (2013.01); *H05K 2201/10272* (2013.01)

(58) Field of Classification Search
CPC .. H05K 5/0026; H05K 1/0215; H01R 12/716; H01R 13/6215; H01R 4/30; H01R 4/64
See application file for complete search history.

(56) References Cited

U.S. PATENT DOCUMENTS

| 3,097,032 A | 7/1963 | Hochheiser |
|---|---|---|
| 3,218,606 A | 11/1965 | Schultz |
| (Continued) | | |

FOREIGN PATENT DOCUMENTS

| CN | 1538559 A | 10/2004 |
|---|---|---|
| CN | 104218419 A | 12/2014 |
| (Continued) | | |

OTHER PUBLICATIONS

Balana Avila, Joan, et al., Amendment Under 37 C.F.R. § 1.111 for U.S. Appl. No. 16/906,692, filed with the U.S. Patent and Trademark Office dated Mar. 2, 2022 (8 Pages).

*Primary Examiner* — Hoa C Nguyen
*Assistant Examiner* — Amol H Patel
(74) *Attorney, Agent, or Firm* — Brooks Kushman P.C.

(57) ABSTRACT

A system is described for providing an electrical ground connection for a circuit assembly. The system may include a housing for the circuit assembly, the housing having an electrically conductive fixation member configured for attachment to an electrically conductive element outside the housing. The system may also include an electrically conductive feature having a first end and a second end, the first end configured to cooperate with the electrically conductive fixation member inside the housing and the second end configured for attachment to the circuit assembly. Attachment of the electrically conductive fixation member to the electrically conductive element outside the housing enables an electrical ground connection for the circuit assembly via the electrically conductive feature.

18 Claims, 4 Drawing Sheets

(56) References Cited

U.S. PATENT DOCUMENTS

| | | |
|---|---|---|
| 3,270,251 A | 8/1966 | Evans |
| 3,836,935 A | 9/1974 | Johnson |
| 3,932,934 A | 1/1976 | Lynch et al. |
| 4,050,621 A | 9/1977 | Bouley |
| 4,662,691 A | 5/1987 | Derdzinski |
| 4,663,815 A | 5/1987 | Hartman et al. |
| 4,884,335 A | 12/1989 | McCoy et al. |
| 4,890,199 A | 12/1989 | Beutler |
| 5,131,853 A | 7/1992 | Meyer |
| 5,199,887 A | 4/1993 | Tacono |
| 5,218,760 A | 6/1993 | Colton et al. |
| 5,599,208 A | 2/1997 | Ward |
| 5,688,130 A | 11/1997 | Huang |
| 5,704,752 A | 1/1998 | Logerot |
| 5,802,699 A | 9/1998 | Fjelstad et al. |
| 5,816,835 A | 10/1998 | Meszaros |
| 5,997,367 A | 12/1999 | Nowak et al. |
| 6,062,919 A | 5/2000 | Trafton |
| 6,067,236 A | 5/2000 | White |
| 6,206,728 B1 | 3/2001 | Krehbiel et al. |
| 6,413,119 B1 | 7/2002 | Gabrisko, Jr. et al. |
| 6,493,233 B1 | 12/2002 | De Lorenzo et al. |
| 6,783,376 B2 | 8/2004 | Will et al. |
| 6,790,051 B1 | 9/2004 | Secall et al. |
| 6,799,980 B2 | 10/2004 | Bloomfield et al. |
| 6,824,403 B2 | 11/2004 | Hall et al. |
| 6,837,730 B2 | 1/2005 | Poh et al. |
| 6,980,017 B1 | 12/2005 | Farnworth et al. |
| 7,044,755 B2 | 5/2006 | Hatakeyama |
| 7,149,089 B2 | 12/2006 | Blasko et al. |
| 7,297,026 B2 | 11/2007 | Toda et al. |
| 7,347,698 B2 | 3/2008 | Dittmann |
| 7,351,091 B1 | 4/2008 | Zhang |
| 7,354,276 B2 | 4/2008 | Dittmann |
| 7,361,055 B2 | 4/2008 | Fuerst |
| 7,364,442 B2 | 4/2008 | Bang et al. |
| 7,396,254 B2 | 7/2008 | Harmelink et al. |
| 7,510,407 B1 | 3/2009 | Blasko et al. |
| 7,581,965 B1 | 9/2009 | Upasani et al. |
| 7,943,859 B2 | 5/2011 | Ambo et al. |
| 7,976,319 B2 | 7/2011 | Nguyen et al. |
| 8,038,465 B2 | 10/2011 | Pavlovic |
| 8,294,043 B2 | 10/2012 | Munoz et al. |
| 8,696,367 B2 | 4/2014 | Daughtry, Jr. et al. |
| 8,790,122 B2 | 7/2014 | Malehorn, II et al. |
| 8,854,835 B2 | 10/2014 | Feldstein et al. |
| 8,979,452 B2 | 3/2015 | Ikuno |
| 9,167,698 B2 | 10/2015 | Konda et al. |
| 9,257,778 B2 | 2/2016 | Buck et al. |
| 9,320,165 B2 | 4/2016 | Gruber |
| 9,437,974 B2 | 9/2016 | Glick et al. |
| 9,496,632 B2 | 11/2016 | Schmalbuch et al. |
| 9,543,703 B2 | 1/2017 | Horchler et al. |
| 9,680,247 B1 | 6/2017 | Glick et al. |
| 9,705,214 B2 | 7/2017 | Tramet et al. |
| 9,705,259 B2 | 7/2017 | Feldner |
| 9,711,876 B2 | 7/2017 | Feye-Hohmann |
| 9,711,926 B2 | 7/2017 | Belanger, Jr. |
| 9,774,117 B1 | 9/2017 | Jackson et al. |
| 9,873,392 B2 | 1/2018 | Matsumura et al. |
| 10,050,358 B2 | 8/2018 | Muller et al. |
| 10,122,044 B2 | 11/2018 | De Souza et al. |
| 10,348,029 B2 | 7/2019 | Flender et al. |
| 10,418,728 B2 | 9/2019 | Fu et al. |
| 10,573,983 B2 | 2/2020 | Webber et al. |
| 10,673,160 B2 | 6/2020 | Baier et al. |
| 10,707,598 B2 | 7/2020 | Fu et al. |
| 2003/0024734 A1 | 2/2003 | Ineson et al. |
| 2004/0209498 A1 | 10/2004 | Hatakeyama |
| 2010/0040431 A1 | 2/2010 | Suzuki |
| 2010/0112859 A1 | 5/2010 | Olawsky et al. |
| 2010/0311255 A1 | 12/2010 | Reisinger et al. |
| 2011/0059633 A1 | 3/2011 | Chen et al. |
| 2020/0112108 A1* | 4/2020 | Yoshida ............... H05K 1/0215 |
| 2020/0136325 A1* | 4/2020 | Yoshida ............... H01R 13/743 |
| 2020/0176902 A1 | 6/2020 | Fu et al. |
| 2020/0370733 A1 | 11/2020 | Hatano |
| 2021/0313737 A1* | 10/2021 | Scharnreithner ........ H01R 4/64 |
| 2021/0399501 A1 | 12/2021 | Balana Avila et al. |
| 2022/0045444 A1 | 2/2022 | Blanco et al. |

FOREIGN PATENT DOCUMENTS

| | | |
|---|---|---|
| CN | 105514626 A | 4/2016 |
| CN | 107069340 A | 8/2017 |
| EP | 1983811 A2 | 10/2008 |
| EP | 3001508 A1 | 3/2016 |
| FR | 3039329 A1 | 1/2017 |
| JP | H10189316 A | 7/1998 |

* cited by examiner

SYSTEM AND METHOD FOR PROVIDING AN ELECTRICAL GROUND CONNECTION FOR A CIRCUIT ASSEMBLY

TECHNICAL FIELD

The following relates to a system and method for providing an electrical ground connection for a circuit assembly.

BACKGROUND

Automotive vehicles having high voltage (HV) batteries, such as electric vehicles (EV) and hybrid electric vehicles (HEV), may include battery monitoring systems (BMS) to monitor and/or improve performance the HV batteries. In that regard, a BMS is an electronic unit that is inserted by the automotive original equipment manufacturer (OEM) inside a housing for an EV or HEV HV battery as part of a vehicle HV battery system, which may include battery cells, a cooling system, and battery cell monitoring electronics.

The BMS of a HV battery system requires a good connection to the vehicle ground (GND), such as the chassis of the vehicle. Indeed, such a ground connection may be required by various electronic assemblies or electronic arrangements that may be used throughout any type of vehicle, which electronic assemblies or electronic arrangements may include and/or comprise circuit assemblies, printed circuit boards (PCB), fuse boxes, controllers, modules, units, systems, or any other type of electronic assembly or electronic arrangement.

In that regard, compact and/or restrictive requirements may govern the placement of a HV battery system in an EV or HEV. Such compact and/or restrictive placement requirements for a HV battery system may include and/or affect the vehicle ground connection needed by a BMS. Similar design constraints and/or requirements may likewise include and/or affect the ground connection needed by any other type of electronic assembly or electronic arrangement used in a vehicle. As a result, a need exists for an improved system and method for providing an electrical ground connection for a circuit assembly, such as may be included in a BMS for a HV battery system for an EV or HEV.

SUMMARY

According to one non-limiting exemplary embodiment described herein, a system for providing an electrical ground connection for a circuit assembly is provided. The system may comprise a housing for the circuit assembly, the housing having an electrically conductive fixation member configured for attachment to an electrically conductive element outside the housing. The system may further comprise an electrically conductive feature having a first end and a second end, the first end configured to cooperate with the electrically conductive fixation member inside the housing and the second end configured for attachment to the circuit assembly. Attachment of the electrically conductive fixation member to the electrically conductive element outside the housing enables an electrical ground connection for the circuit assembly via the electrically conductive feature.

According to another non-limiting exemplary embodiment described herein, a system for providing an electrical ground connection for a circuit assembly is provided. The system may comprise an electrically conductive fixation member having a first portion configured to extend inside a housing for the circuit assembly and a second portion configured to extend outside the housing, the second portion further configured for attachment to an electrically conductive element. The system may further comprise an electrically conductive feature having a first end and a second end, the first end configured to cooperate with the first portion of the electrically conductive fixation member inside the housing and the second end configured for attachment to the circuit assembly. Attachment of the second portion of the electrically conductive fixation member to the electrically conductive element outside the housing enables an electrical ground connection for the circuit assembly via the electrically conductive feature.

According to yet another non-limiting exemplary embodiment described herein, a method for providing an electrical ground connection for a circuit assembly is provided. The method may comprise attaching a first end of an electrically conductive feature to a first portion of an electrically conductive fixation member, wherein the first portion of the electrically conductive fixation member is configured to extend inside a housing for the circuit assembly, and wherein the electrically conductive feature comprises (i) a conductive paint on a surface of the housing for the circuit assembly, (ii) a busbar, (iii) a wire, or (iv) a conductive mesh. The method may further comprise installing the circuit assembly into the housing, and attaching a second end of the electrically conductive feature to the circuit assembly.

A detailed description of these and other non-limiting exemplary embodiments of a system and method for providing an electrical ground connection for a circuit assembly is set forth below together with the accompanying drawings.

DETAILED DESCRIPTION

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting, but merely as a representative basis for teaching one skilled in the art.

With reference to the Figures, a more detailed description of non-limiting exemplary embodiments of a system and method for providing an electrical ground connection for a circuit assembly will be provided. For ease of illustration and to facilitate understanding, like reference numerals may be used herein for like components and features throughout the drawings.

As previously described, compact and/or restrictive placement requirements for a HV battery system in an EV or HEV may include and/or affect the vehicle ground connection needed by a BMS. Similar design constraints and/or requirements may likewise include and/or affect the ground connection needed by any other type of electronic assembly or electronic arrangement used in a vehicle. As a result, a need exists for an improved system and method for providing an electrical ground connection for a circuit assembly, such as may be included in a BMS for a HV battery system for an EV or HEV.

Figures 1A, 1B:
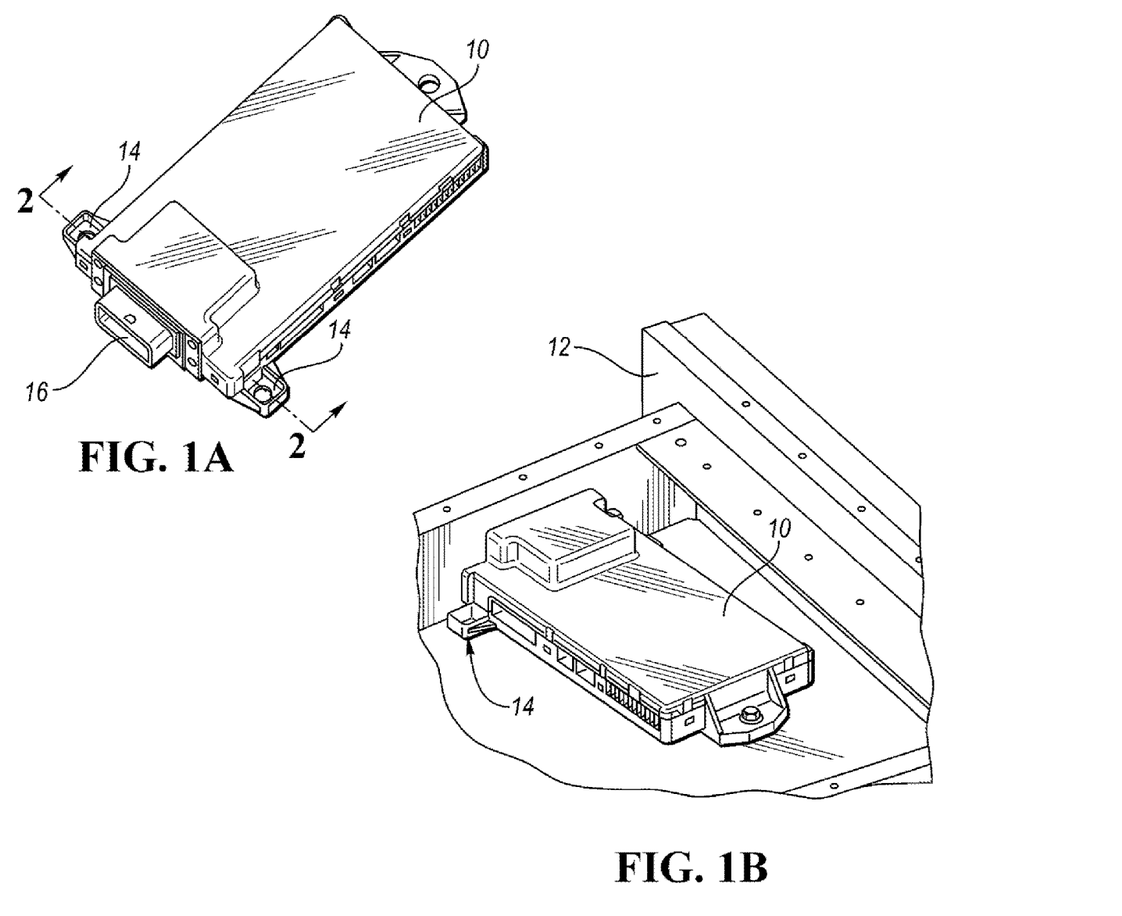
FIGS. 1A-1C are perspective views of a battery monitoring system module for use in a high-voltage battery housing of an electric or hybrid electric vehicle.
Figure 1C:
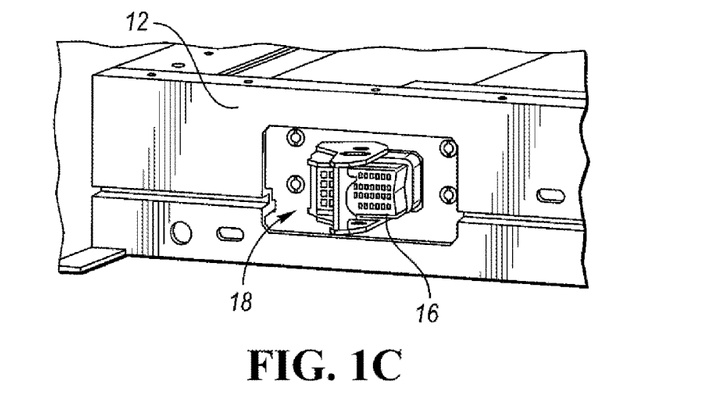

In that regard, FIGS. 1A-1C illustrate perspective views of a module for a battery monitoring system (BMS) for use in a high voltage (HV) battery housing of an electric vehicle (EV) or hybrid electric vehicle (HEV), where the HV battery housing is not size-restricted. As seen therein, according to the configuration and/or design shown, the BMS module 10 may be inserted in a housing 12 for a HV battery. The BMS module 10 may include mounting or fixation features 14, which may include electrically conductive tabs having apertures formed therein. The mounting/fixation features 14 are accessible after insertion of the BMS module 10 into the HV battery housing 12. As a result, using the mounting/fixation features 14, the BMS module 10 may be screwed into the bottom chassis plate of the HV battery housing 12. The BMS module 10 may also be provided with a horizontally oriented electrical connector 16 on one side or a side surface thereof, and the HV battery housing 12 may be provided with a lateral opening 18 through which the electrical connector 16 may extend when the BMS module 10 is mounted to the HV battery housing 12.

Figure 2:
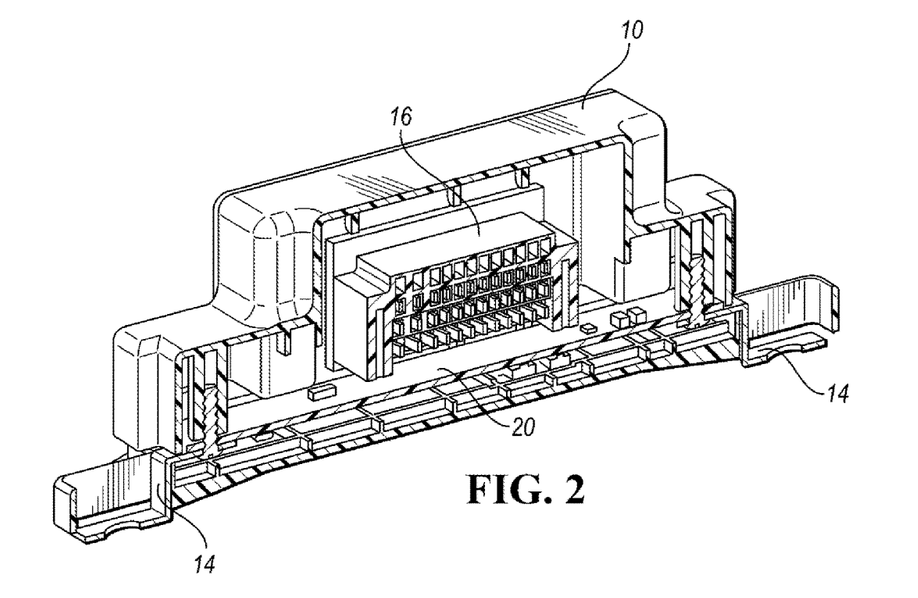
FIG. 2 is a cross-sectional view of the battery monitoring system module of FIG. 1A, taken along the line 2-2.

FIG. 2 illustrates a cross-sectional view of the BMS module 10 of FIG. 1A, taken along the line 2-2. As seen therein, the electrically conductive mounting/fixation features 14 of the BMS module 10 may be connected or attached to a printed circuit board (PCB) 20 of the BMS module 10. As a result, fixation or attachment of the BMS module 10 to the HV battery housing 12 (see FIG. 1B) using screws (not shown) inserted through the apertures formed in the mounting/fixation features 14 also provides a robust electrical ground connection for the BMS module 10, as the HV battery housing 12 (see FIG. 1B) is electrically conductive.

Figure 3:
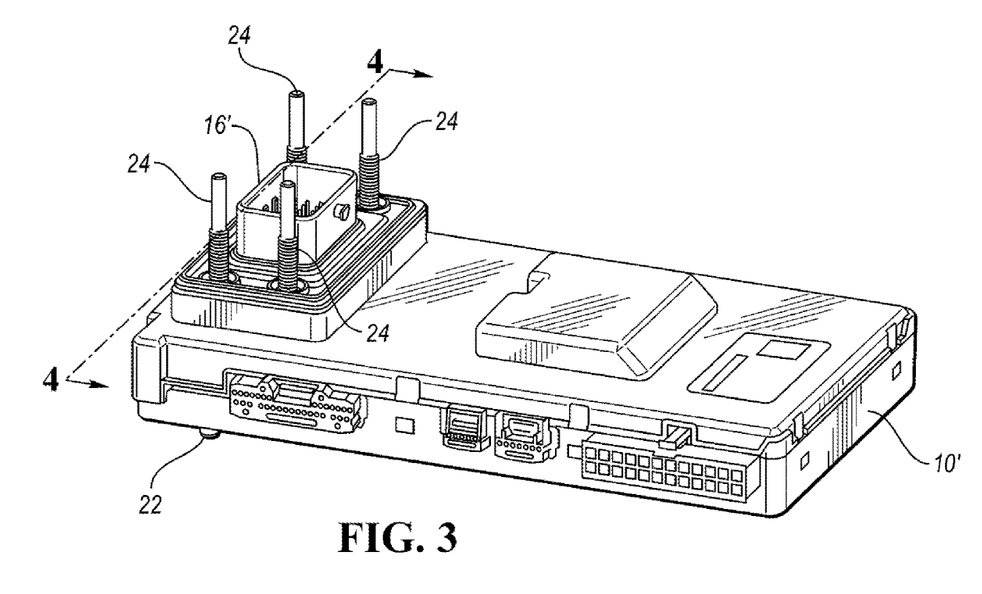
FIG. 3 is a perspective view of an alternative battery monitoring system module including a system and method for providing a ground connection for a circuit assembly according to one non-limiting exemplary embodiment of the present disclosure.

Referring now to FIG. 3, a perspective view is shown of an alternative design for a BMS module 10' including a system and method for providing a ground connection for a circuit assembly according to one non-limiting exemplary embodiment of the present disclosure. As seen therein, the alternative design for the BMS module 10' may include one or more fixation features 22 provided on a bottom surface or side of the BMS module 10'. Such fixation features 22 may be configured for cooperation with features provided on a bottom chassis surface a HV battery housing 12', such as by a snap-in or a snap-on like operation, to thereby mount or attach the BMS module 10' to the HV battery housing 12' in an efficient and effective manner. Such features 22 are used because there is no space for a tool (at the OEM assembly line) that would fix screws in position. Alternative, a snap-in or snap-on like operations may not be required, but only centering, in which case the BMS will only be fixed to the top cover. Such features 22 and fixation are described in greater detail in co-pending U.S. patent application Ser. No. 16/674,593, entitled "System And Method For Mounting An Electronics Arrangement," filed on Nov. 5, 2019, the disclosure of which is hereby incorporated herein by reference in its entirety.

As also seen in FIG. 3, the alternative design of the BMS module 10' may include a vertically oriented electrical connector 16' provided on a top side or top surface thereof. The previously described fixation of the BMS module 10' to the HV battery housing 12' may be blind, and the BMS module 10' may also be provided with one or more fixation members 24 on a top side or top surface thereof. In that regard, fixation members 24, which may comprise threaded bolts or screws, may be configured to attach or fix the BMS module 10' to a top cover of the HV battery housing 12' (see FIG. 4B).

Thus, the BMS module 10 shown in FIGS. 1A-1C and 2 has a physical and electrical connection to a bottom plate or surface of the HV battery housing 12. The BMS module 10 may be fixed to the HV battery housing 12 because the fixation points are accessible for screwing after the BMS module 10 has been inserted in place in the HV battery housing 12.

In contrast, the BMS module 10' shown in FIG. 3 has a blind mechanical fixation, or location, or initial placement position to an interior surface of the HV battery housing 12' via the non-conductive (e.g., plastic) fixation (or location or initial placement position) features 22 of the housing of the BMS module 10'. Because the housing of the BMS module 10', including the fixation (or location or initial placement position) features 22, are non-conductive (e.g., plastic), only the external fixation members 24 (e.g., threaded bolts or screws) configured for attaching the BMS module 10' to a top surface or cover of the HV battery housing 12' are available for establishing a ground connection for the BMS module 10'. In that regard, one or more of the fixation members 24 may be electrically conductive and, as a result, may also be used to connect the BMS module 10' to an electrically conductive element outside the housing of the BMS module 10' and thereby establish, enable, create, provide, or complete an electrical ground connection or path, either directly or indirectly through the HV battery housing 12', as will be further described herein.

Figure 4A:
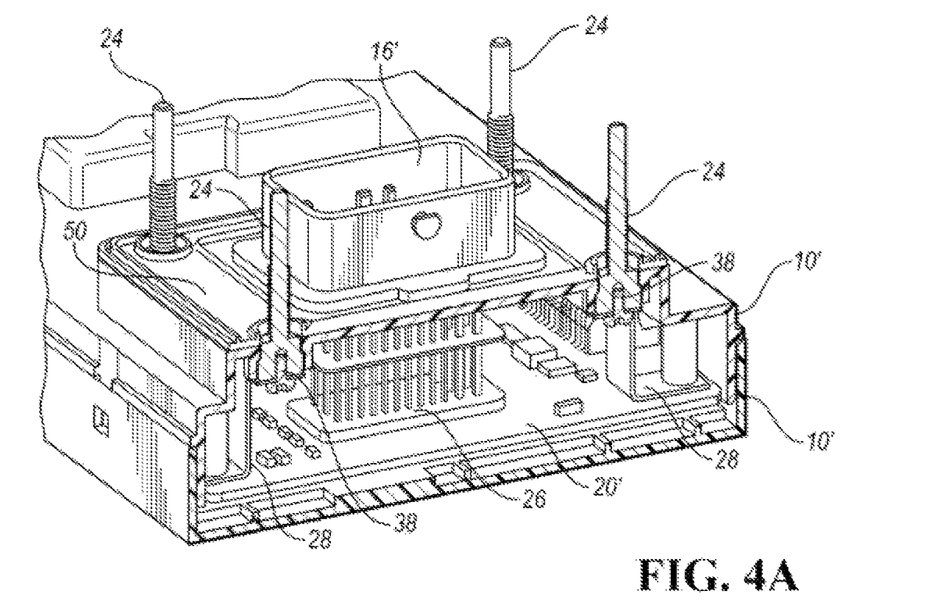
FIGS. 4A and 4B are a lateral cross-sectional views of the alternative battery monitoring system module of FIG. 3 taken along line 4-4 thereof, including a system and method for providing a ground connection for a circuit assembly according to one non-limiting exemplary embodiment of the present disclosure.
Figure 4B:
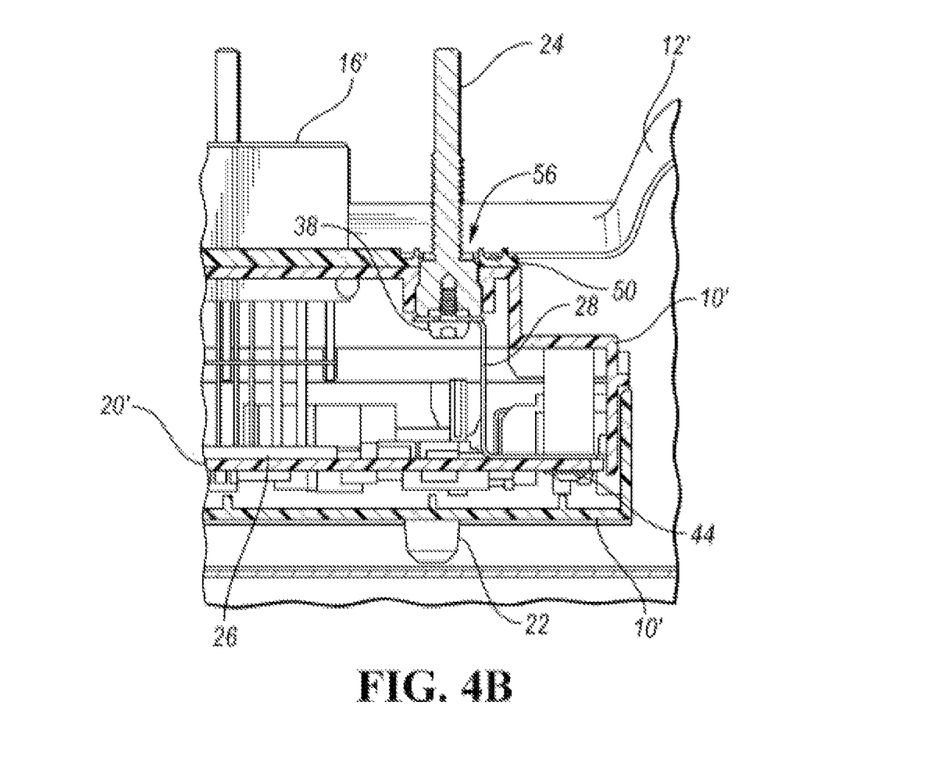

FIGS. 4A and 4B are lateral cross-sectional views of the alternative BMS module 10' of FIG. 3 taken along line 4-4 thereof, illustrating a system and method for providing a ground connection for a circuit assembly according to one non-limiting exemplary embodiment of the present disclosure. As seen therein, the electrical connector 16' of the BMS module 10' may include or comprise a pin header 26 having a plurality of pins. The pin header 26 may be configured for attachment to a printed circuit board (PCB) 20' of the BMS module 10', which PCB 20' may include or have mounted thereon or therein any type or number of electrical or electronic components for use in monitoring a HV battery for an EV or HEV. In that regard, the electrical connector 16', the pin header 26, the PCB 20', and any of the electrical or electronic components previously described may comprise, be referred to as, constitute, or include an electric, electrical, or electronic circuit or circuit assembly.

Figure 5A:
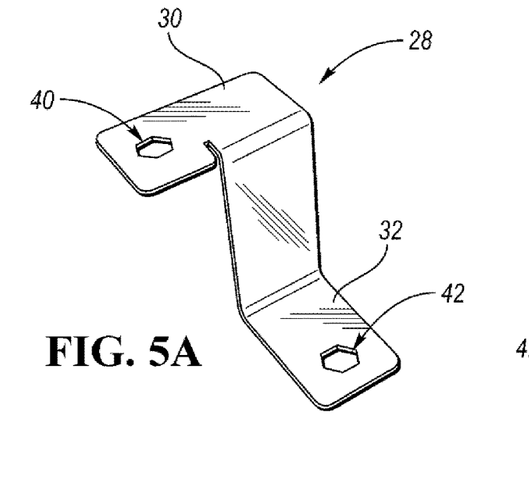
FIGS. 5A and 5B are perspective views of exemplary electrically conductive features for the alternative battery monitoring system module of FIG. 3 including a system and method for providing a ground connection for a circuit assembly according to one non-limiting exemplary embodiment of the present disclosure.
Figure 5B:
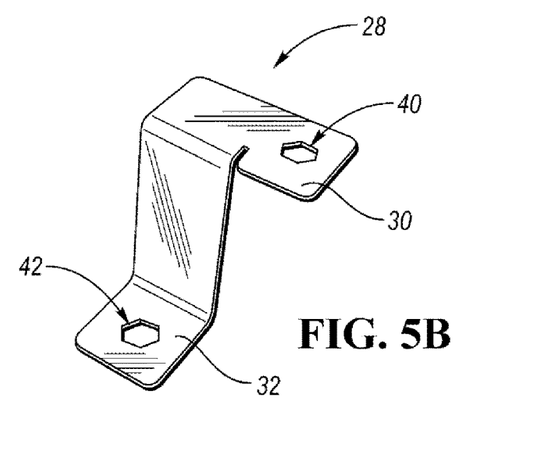

The BMS module 10' may also include or comprise an electrically conductive feature which may comprise one or more busbars 28. FIGS. 5A and 5B are perspective views of exemplary electrically conductive features 28 for the alternative battery monitoring system module of FIG. 3 including a system and method for providing a ground connection for a circuit assembly according to one non-limiting exemplary embodiment of the present disclosure. As seen therein, and with continuing reference to FIGS. 4A and 4B, each busbar 28 may extend in a plurality of planes and may have a first end, such as tab 30, which may be configured for attachment to the electrically conductive fixation member 24 inside the housing of the BMS module 10'. The housing of the BMS module 10' may also include positioning or placement elements or features (not shown) to facilitate correct positioning of the busbar 28 in place.

Figure 6A:
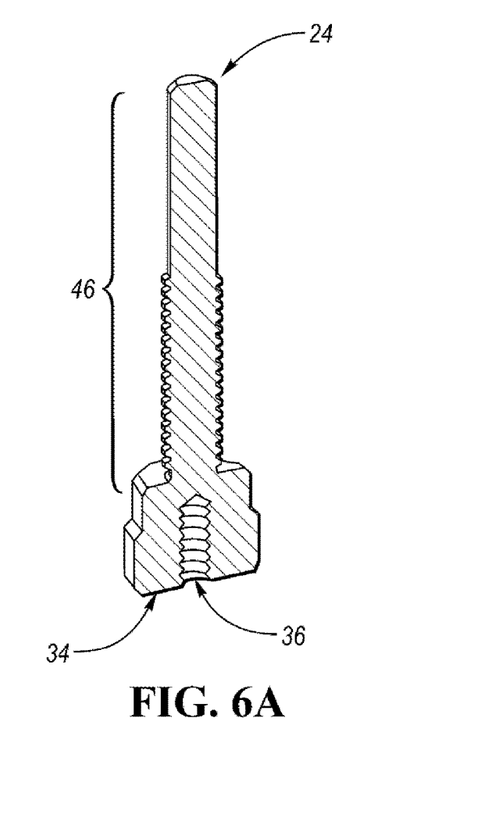
FIGS. 6A and 6B are cross-sectional and perspective views, respectively, of exemplary electrically conductive fixation members for the alternative battery monitoring system module of FIG. 3 including a system and method for providing a ground connection for a circuit assembly according to one non-limiting exemplary embodiment of the present disclosure.
Figure 6B:
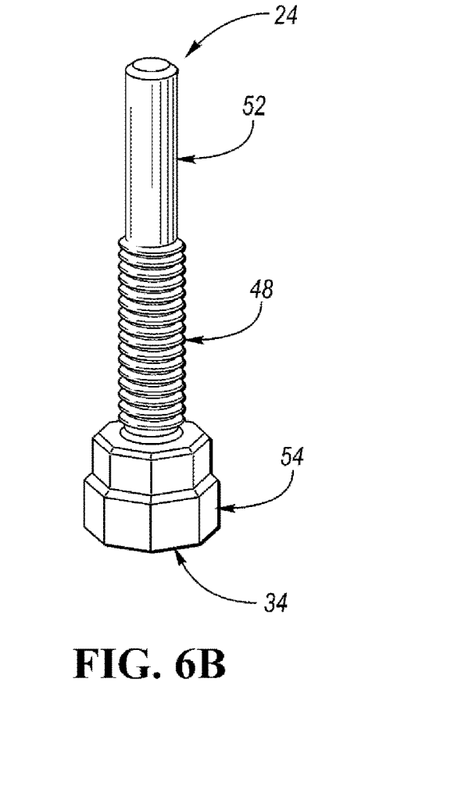

In that regard, FIGS. 6A and 6B are cross-sectional and perspective views, respectively, of exemplary electrically conductive fixation members 24 for the alternative battery monitoring system module of FIG. 3 including a system and method for providing a ground connection for a circuit assembly according to one non-limiting exemplary embodiment of the present disclosure. As seen therein, and with continuing reference to FIGS. 4A, 4B, 5A, and 5B, the electrically conductive fixation member 24 may comprise a first portion 34 configured to extend inside the housing of the BMS module 10'. The first portion 34 of the electrically conductive fixation member 24 and the first tab 30 of the busbar 28 may be configured for attachment by an adhesive or a weld. Alternatively, the first portion 34 of the electrically conductive fixation member 24 may have a threaded recess 36 formed therein configured to receive a screw 38 and the first tab 30 of the busbar 28 may have an opening 40 formed therein configured to receive the screw 38. The housing of the BMS module 10' may also include positioning or placement elements or features (not shown) to facilitate correct positioning or placement of the busbar and to prevent rotation of the busbar while the screw 38 is being fixed inside the recess 36 of fixation member 24.

Referring still to FIGS. 4A, 4B, 5A, and 5B, each busbar 28 may also have a second end, such as tab 32, which may be configured for attachment to the circuit assembly or PCB 20'. More specifically, the second tab 32 of the busbar 28 may have an opening 42 formed therein configured to receive a screw 44 and the circuit assembly or PCB 20' may have an opening formed therein (not shown) configured to receive the screw 44 for attachment of the second tab 32 of the busbar 28 to the PCB 20'. In that regard, the busbar 28 may be fixed or attached in such a fashion to an electrical ground of the PCB 20', which may take the form of or comprise an island, trace, point, layer, or component of the PCB 20'. It should also be noted that the screw 44 may also be used to fix the PCB 20' in place, thus avoiding the need to use an extra screw for that connection to ground. Alternatively, the second end or tab 32 of the busbar 28 may be shaped, configured, or include a feature (not shown) for direct fixation into the PCB, such as by surface or through hole soldering, or as a press-fit terminal.

According to the system and method of the present disclosure, the busbar(s) 28 may be used to establish, enable, create, provide, or complete a ground connection from a vehicle chassis (not shown) to an electrical ground of the PCB 20' through the electrically conductive fixation members 24. In that regard, still referring to FIGS. 4A, 4B, 6A, and 6B, the fixation members 24 may be overmolded in the non-conductive (e.g., plastic) housing of the BMS module 10'. A portion 46 of the fixation member(s) 24 may extend outside the housing of the BMS module 10', thereby providing for or enabling both electrical and mechanical fixation of the BMS module 10' to an electrically conductive element or electrical ground terminal or electrical ground path outside the housing of the BMS module 10', such as the electrically conductive cover of the HV battery housing 12'. Such overmolding of the fixation members 24 in the plastic housing of the BMS module 10' may leave the portion 34 of the fixation members 24 accessible for contact with or attachment to the busbar 28. As shown, each of the fixation members 24 may have a first portion 34 configured to extend and/or be exposed inside the housing of the BMS module 10' and, as previously described, configured for attachment to the busbar 28.

The top portion or cover of the HV battery housing 12' may have an aperture formed therein configured to receive the vertically oriented electrical connector 16' of the BMS module 10'. The cover of the HV battery housing 12' may also have apertures 56 formed therein configured to receive the second portion 46 of the fixation members 24, which second portion 46 may be configured to extend outside the housing of the BMS module 10'. The electrically conductive fixation members 24 may also be provided with a surface or shoulder configured to contact the electrically conductive HV battery housing 12' and thereby ensure robust electrical contact and conductivity between the fixation member 24 and the HV battery housing 12'.

As previously described, the fixation members 24 may comprise a bolt or screw having a threaded portion 48. One or more threaded nuts (not shown) may be provided and/or configured for mechanical (e.g., screwed) and/or electrical fixation or attachment of the HV battery housing 12' to the fixation members 24. The electrical ground connection path established (see FIG. 4B) may be described as follows: GND of PCB 20'→busbar 28→fixation member 24→cover of HV-battery housing 12'→vehicle chassis (GND) (not shown). A water-tight sealing member 50, such as a rubber or silicon gasket, may also be provided between a cover of the HV battery housing 12' and a top cover of the housing of the BMS module 10'. The purpose of such sealing is to avoid water (liquid) ingress into the HV battery system. The sealing member 50 may be provided with a "lip" to close the cover of the HV battery housing 12' with the exterior surface of the cover of the BMS module 10'. The sealing member 50 may also be provided with another "lip" surrounding each of the fixation members 24 to ensure no ingress of water (liquid) into the BMS module 10' through a protruding fixation member 24 (i.e., between bolts 24 and the surrounding plastic). The screw-bolt fixation also compresses the sealing member 50 to ensure that it seals properly. To ensure connection mechanical torque and electrical contact, no gasket is provided between the bolt, cover, nut fixation. In that regard, as the nut (not shown) is metallic, it is also in electrical contact.

It should also be noted that the fixation members 24 may also be provided or configured with an extension 52 which may serve or act as an aid for centering the apertures 56 formed in the HV battery housing 12' with the fixation members 24. As previously described, the electrically conductive fixation member 24 may be overmolded in the housing of the BMS module 10'. In that regard, the electrically conductive fixation member 24 may comprises an anti-rotation feature 54 configured to resist rotation of the electrically conductive fixation member 24 in the housing of the BMS module 10' during rotation of the nut (not shown)

on the threaded shaft 48 of the electrically conductive fixation member 24. As seen in FIG. 6B, such an anti-rotation feature 54 of the fixation member 24 may take the form of a head having a multi-faceted or multi-faced (i.e., non-circular) circumference, although any know type of anti-rotation feature may alternatively be provided.

The system and method of the present disclosure thus provide attachment of the second portion 46 of the electrically conductive fixation member 24 to the electrically conductive element 12' outside the housing of the BMS module 10', thereby enabling an electrical ground connection for the circuit assembly 20' via the electrically conductive feature comprising the busbar 28. The system and method of the present disclosure thus provide direct connection of an electronic circuit to a vehicle chassis (GND) in an efficient fashion, thereby simplifying installation, assembly, and/or manufacturing as well as minimizing cost.

Thus, the present disclosure provides a system and method for providing an electrical ground connection for a circuit assembly. According to the system and method of the present disclosure, the first tab 30 of the electrically conductive feature 28 may be attached to the first portion 34 of the electrically conductive fixation member 24. In that regard, the electrically conductive feature 28 may comprise a busbar extending in a plurality of planes and the first portion 34 of the electrically conductive fixation member 24 may be configured to extend inside the housing of the BMS module 10' for the circuit assembly or PCB 20'. According to the system and method of the present disclosure, the circuit assembly or PCB 20' may be installed into the housing of the BMS module 10', and the second tab 32 of the electrically conductive feature comprising the busbar 28 may be attached to the circuit assembly or PCB 20'. The PCB 20' may then be enclosed with a bottom portion of the housing of the BMS module 10'.

As previously described, the electrically conductive fixation member 24 may comprise a second portion 46 configured to extend outside the housing of the BMS module 10' for attachment to the electrically conductive element 12'. In that regard, the second portion 46 of the electrically conductive fixation member 24 may be attached to the electrically conductive element 12' outside the housing of the BMS module 10' to provide an electrical ground connection for the circuit assembly or PCB 20' via the electrically conductive feature comprising the busbar 28.

As also previously described, the first portion 34 of the electrically conductive fixation member 24 may have a threaded recess 36 formed therein configured to receive a screw 38 and the first tab 30 of the busbar 28 may have an opening 40 formed therein configured to receive the screw 38. Attaching the first tab 30 of the electrically conductive feature comprising the busbar 28 to the first portion 34 of the electrically conductive fixation member 24 may therefore comprise screwing the first tab 30 of the busbar 28 to the first portion 34 of the electrically conductive fixation member 24. Moreover, the electrically conductive fixation member 24 may be overmolded in the housing of the BMS module 10'. It should also be noted that, as an alternative to the connection of the busbar 28 to the fixation member 24 described previously, the busbar 28 may also be overmolded into the housing of the BMS module 10'. In such an embodiment, because robustness may be provided by the housing plastic, instead of a busbar, the electrically conductive feature 28 may alternatively comprise a thinner connection element, such as a wire, a conductive mesh, or a conductive painted (or the like) path. It should also be noted that the busbar 28 may take the form of a member extending from (and which may be integral with) the fixation member 24. Thus, the first end 30 of the busbar 28 may be configured to cooperate with the first portion 34 of the fixation member 24, such as by integrally extending from the first portion 34 of the fixation member 24 or by being configured to be attached, connected, or joined to or with the first portion 34 of the fixation member 24 as previously described herein. The busbar 28 may also have an extension (not shown) at the second end 32, which may be rod-like, which extends downward and is configured to fit into or otherwise cooperate with a hole formed in the PCB 20' to provide for attachment of the busbar 28 to the PCB 20', such as by a screw or by a soldered or press-fit connection.

Once assembled, the BMS module 10' may be inserted into and fixed to the bottom portion or base of the HV battery housing 12', such as by fixation features 22. The top portion or cover of the HV battery housing 12' may be attached to the BMS module 10' in a closure operation using the fixation members 24 formed in and extending outside the housing of the BMS module 10'. The fixation members 24 may be received by cooperating apertures 56 formed in the cover of the HV battery housing 12', which may be secured to the BMS module 10' using nut(s) (not shown). A ground connection to the circuit assembly may be completed, created, established, enabled, or provided by integration of the HV battery housing 12' into a vehicle, such as an EV or HEV.

The present disclosure thus describes an improved system and method for providing an electrical ground connection for a circuit assembly, such as may be included in a BMS for a HV battery system for an EV or HEV. In that regard, the HV battery system environment or application described in connection with the system and method for providing an electrical ground connection for a circuit assembly of the present disclosure is exemplary only and the system and method of the present disclosure may be used in other environments or applications. The system and method for providing an electrical ground connection for a circuit assembly described herein overcome, address, solve, or mitigate compact and/or restrictive placement requirements for a HV battery system in an EV or HEV that may include and/or affect the vehicle ground connection needed by a BMS. The system and method for providing an electrical ground connection for a circuit assembly described herein also overcome, address, solve, or mitigate similar design constraints and/or requirements that may likewise include and/or affect the ground connection needed by any other type of electronic assembly or electronic arrangement used in a vehicle.

As is readily apparent from the foregoing, various non-limiting embodiments of a system and method for providing an electrical ground connection for a circuit assembly have been described. While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A system for providing an electrical ground connection for a circuit assembly, the system comprising:
a housing for the circuit assembly, the housing having an electrically conductive fixation member configured for attachment to an electrically conductive element outside the housing; and an electrically conductive feature having a first end and a second end, the first end configured to cooperate with the electrically conductive fixation member inside the housing and the second end configured for attachment to the circuit assembly;

wherein attachment of the electrically conductive fixation member to the electrically conductive element outside the housing enables the electrical ground connection for the circuit assembly via the electrically conductive feature;

wherein the electrically conductive fixation member comprises a first portion configured to extend inside the housing, the frit portion having a threaded recess formed therein configured to receive a screw, wherein the electrically conductive feather comprises a busbar extending in a plurality of planes and having a first tab, and wherein the first tab of the busbar has an opening formed therein configured to receive the screw.

2. The system of claim 1 wherein the electrically conductive fixation member comprises a first portion configured to extend inside the housing, wherein the electrically conductive feature comprises a busbar extending in a plurality of planes and having a first tab, and wherein the first portion of the electrically conductive fixation member and the first tab of the busbar are configured for attachment by an adhesive or a weld.

3. The system of claim 1 wherein the electrically conductive fixation member comprises a second portion configured to extend outside the housing, the second portion having a threaded shaft adapted to receive a nut for attachment of the electrically conductive fixation member to the electrically conductive element.

4. The system of claim 3 wherein the electrically conductive fixation member is overmolded in the housing.

5. The system of claim 4 wherein the electrically conductive fixation member comprises an anti-rotation feature configured to resist rotation of the electrically conductive fixation member in the housing during rotation of the nut on the threaded shaft of the electrically conductive fixation member.

6. The system of claim 1 wherein the electrically conductive feature comprises a busbar extending in a plurality of planes and having a second tab, wherein the second tab of the busbar has an opening formed therein configured to receive a screw and the circuit assembly comprises a printed circuit board (PCB) having an opening formed therein configured to receive the screw for attachment of the second tab of the busbar to the PCB.

7. The system of claim 1 wherein the electrically conductive feature comprises a busbar, a wire, a conductive mesh, or a conductive paint on a surface of the housing.

8. A system for providing an electrical ground connection for a circuit assembly, the system comprising:

an electrically conductive fixation member having a first portion configured to extend inside a housing for the circuit assembly and a second portion configured to extend outside the housing, the second portion further configured for attachment to an electrically conductive element; and an electrically conductive feature having a first end and a second end, the first end configured to cooperate with the first portion of the electrically conductive fixation member inside the housing and the second end configured for attachment to the circuit assembly;

wherein attachment of the second portion of the electrically conductive fixation member to the electrically conductive element outside the housing enables the electrical ground connection for the circuit assembly via the electrically conductive feature;

wherein the electrically conductive feature comprises a busbar extending in a plurality of planes and having a second tab, wherein the second tab of the busbar has an opening formed therein configured to receive a screw and the circuit assembly comprises a printed circuit board (PCB) having an opening formed therein configured to receive the screw for attachment of the second tab of the busbar to the PCB.

9. The system of claim 8 wherein the electrically conductive feature comprises a busbar extending in a plurality of planes and having a first tab, and wherein the first portion of the electrically conductive fixation member and the first tab of the busbar are configured for attachment by an adhesive or a weld.

10. The system of claim 8 wherein the electrically conductive feature comprises a busbar extending in a plurality of planes and having a first tab, wherein the first portion of the electrically conductive fixation member has a threaded recess formed therein configured to receive a screw, and wherein the first tab of the busbar has an opening formed therein configured to receive the screw.

11. The system of claim 8 wherein the second portion of the electrically conductive fixation member configured to extend outside the housing comprises a threaded shaft adapted to receive a nut for attachment of the electrically conductive fixation member to the electrically conductive element.

12. The system of claim 11 wherein the electrically conductive fixation member is overmolded in the housing.

13. The system of claim 12 wherein the electrically conductive fixation member comprises an anti-rotation feature configured to resist rotation of the electrically conductive fixation member in the housing during rotation of the nut on the threaded shaft of the electrically conductive fixation member.

14. The system of claim 8 wherein the electrically conductive feature comprises a busbar, a wire, a conductive mesh, or a conductive paint on a surface of the housing.

15. A method for providing an electrical ground connection for a circuit assembly, the method comprising:

attaching a first end of an electrically conductive feature to a first portion of an electrically conductive fixation member, wherein the first portion of the electrically conductive fixation member is configured to extend inside a housing for the circuit assembly, and wherein the electrically conductive feature comprises (i) a conductive paint on a surface of the housing for the circuit assembly, (ii) a busbar, (iii) a wire, or (iv) a conductive mesh;

installing the circuit assembly into the housing; and attaching a second end of the electrically conductive feature to the circuit assembly.

16. The method of claim 15 wherein the electrically conductive fixation member comprises a second portion configured to extend outside the housing for attachment to an electrically conductive element, the method further comprising attaching the second portion of the electrically conductive fixation member to the electrically conductive element outside the housing to provide an electrical ground connection for the circuit assembly via the electrically conductive feature.

17. The method of claim 15 wherein the first portion of the electrically conductive fixation member has a threaded recess formed therein configured to receive a screw, wherein the electrically conductive feature comprises a busbar, wherein the busbar comprises a tab having an opening formed therein configured to receive the screw, and wherein attaching the first end of the electrically conductive feature to the first portion of the electrically conductive fixation member comprises screwing the tab of the busbar to the first portion of the electrically conductive fixation member.

18. The method of claim 15 further comprising overmolding the electrically conductive fixation member in the housing.

* * * * *

UNITED STATES PATENT AND TRADEMARK OFFICE
CERTIFICATE OF CORRECTION

| | | |
|---|---|---|
| PATENT NO. | : 11,706,867 B2 | |
| APPLICATION NO. | : 17/248494 | |
| DATED | : July 18, 2023 | |
| INVENTOR(S) | : Joan Balana Avila et al. | |

It is certified that error appears in the above-identified patent and that said Letters Patent is hereby corrected as shown below:

In the Claims

Column 9, Lines 12-13, Claim 1:
After "configured to extend inside the housing, the"
Delete "frit" and
Insert -- first --.

Signed and Sealed this
Twenty-sixth Day of March, 2024

Katherine Kelly Vidal
*Director of the United States Patent and Trademark Office*